(12) United States Patent
Kubis

(10) Patent No.: US 11,682,749 B2
(45) Date of Patent: Jun. 20, 2023

(54) SEMICONDUCTOR DEVICE AND METHOD OF MAKING THE SAME

(71) Applicant: Purdue Research Foundation, West Lafayette, IN (US)

(72) Inventor: Tillmann Christoph Kubis, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 51 days.

(21) Appl. No.: 17/505,477

(22) Filed: Oct. 19, 2021

(65) Prior Publication Data

US 2022/0149239 A1 May 12, 2022

Related U.S. Application Data

(62) Division of application No. 16/718,482, filed on Dec. 18, 2019, now Pat. No. 11,152,542.

(60) Provisional application No. 62/781,839, filed on Dec. 19, 2018.

(51) Int. Cl.
*H01L 33/06* (2010.01)
*H01L 33/32* (2010.01)
*H01L 33/40* (2010.01)

(52) U.S. Cl.
CPC ............ *H01L 33/32* (2013.01); *H01L 33/06* (2013.01); *H01L 33/40* (2013.01)

(58) Field of Classification Search
None
See application file for complete search history.

(56) References Cited

U.S. PATENT DOCUMENTS

| | | | |
|---|---|---|---|
| 9,799,798 B1 * | 10/2017 | Luk | H01L 33/305 |
| 2018/0158913 A1 * | 6/2018 | Withers | H05B 33/145 |
| 2021/0057606 A1 * | 2/2021 | Kubis | H01L 27/15 |

FOREIGN PATENT DOCUMENTS

WO    WO-2019125500 A1 *  6/2019

* cited by examiner

*Primary Examiner* — Bradley Smith
(74) *Attorney, Agent, or Firm* — Purdue Research Foundation

(57) ABSTRACT

A light emitting diode (LED) including a first contact. The LED further includes a first semiconductor layer over the first contact. The first semiconductor layer comprises hexagonal Boron Nitride. Additionally, the LED includes a second semiconductor layer over the first semiconductor layer. The second semiconductor layer comprises at least one hexagonal Boron Nitride quantum well and at least one hexagonal Boron Nitride quantum barrier. Moreover, the LED includes a third semiconductor layer over the second semiconductor layer. The third semiconductor layer comprises hexagonal Boron Nitride. Further, the LED includes a second contact over the third semiconductor layer.

19 Claims, 14 Drawing Sheets

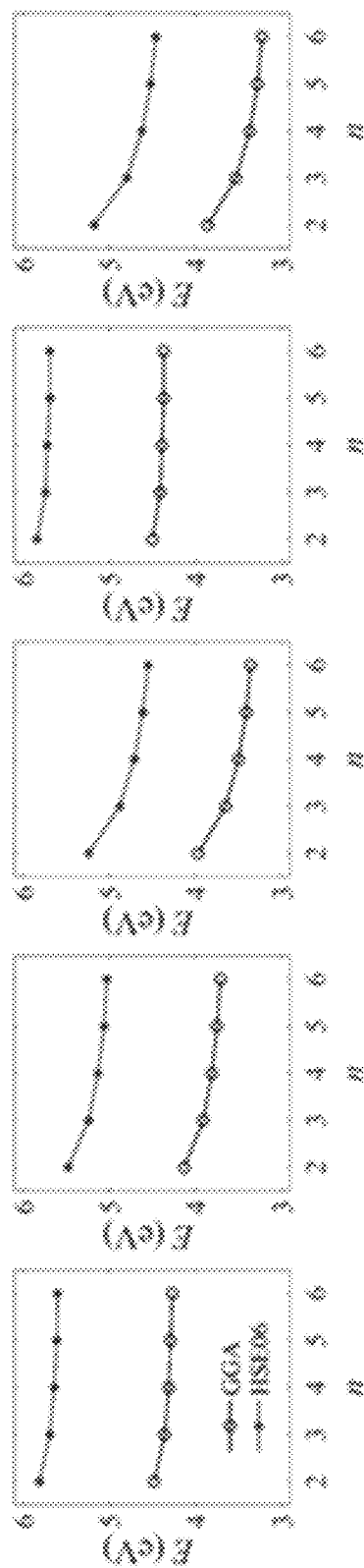

FIG. 2(a)
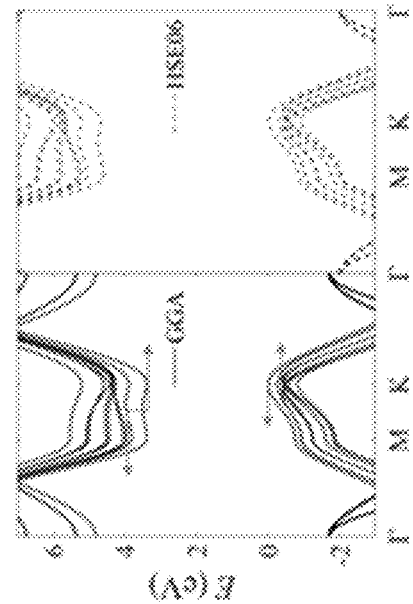
FIG. 2(b)
FIG. 2(c)
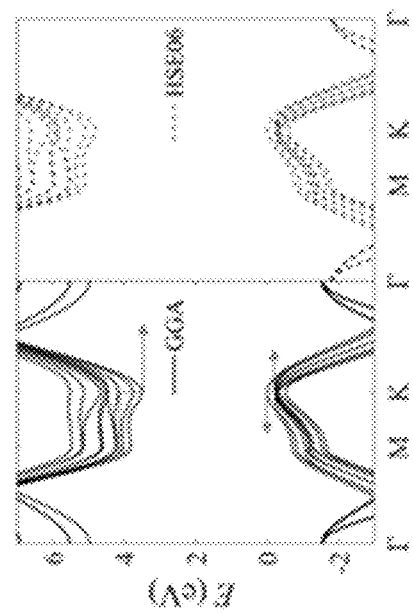
FIG. 2(d)
FIG. 2(e)
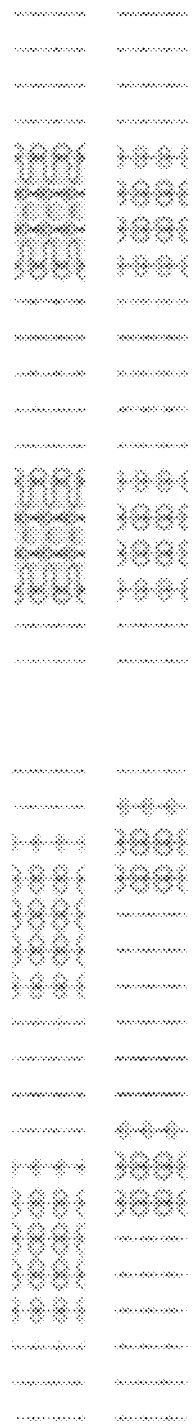
FIG. 2(f)

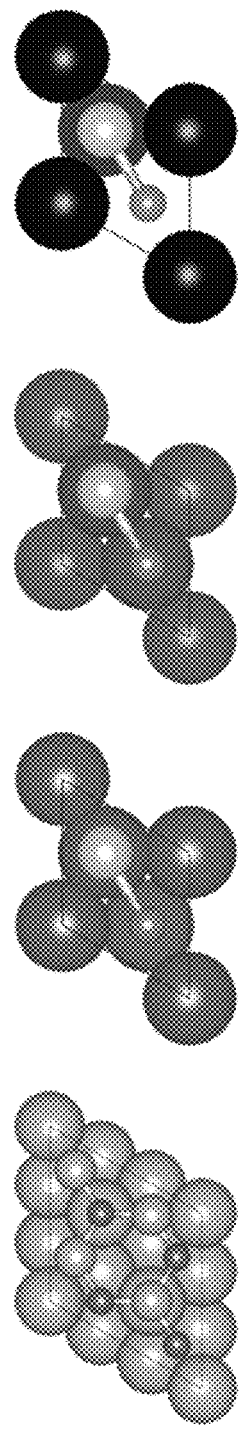 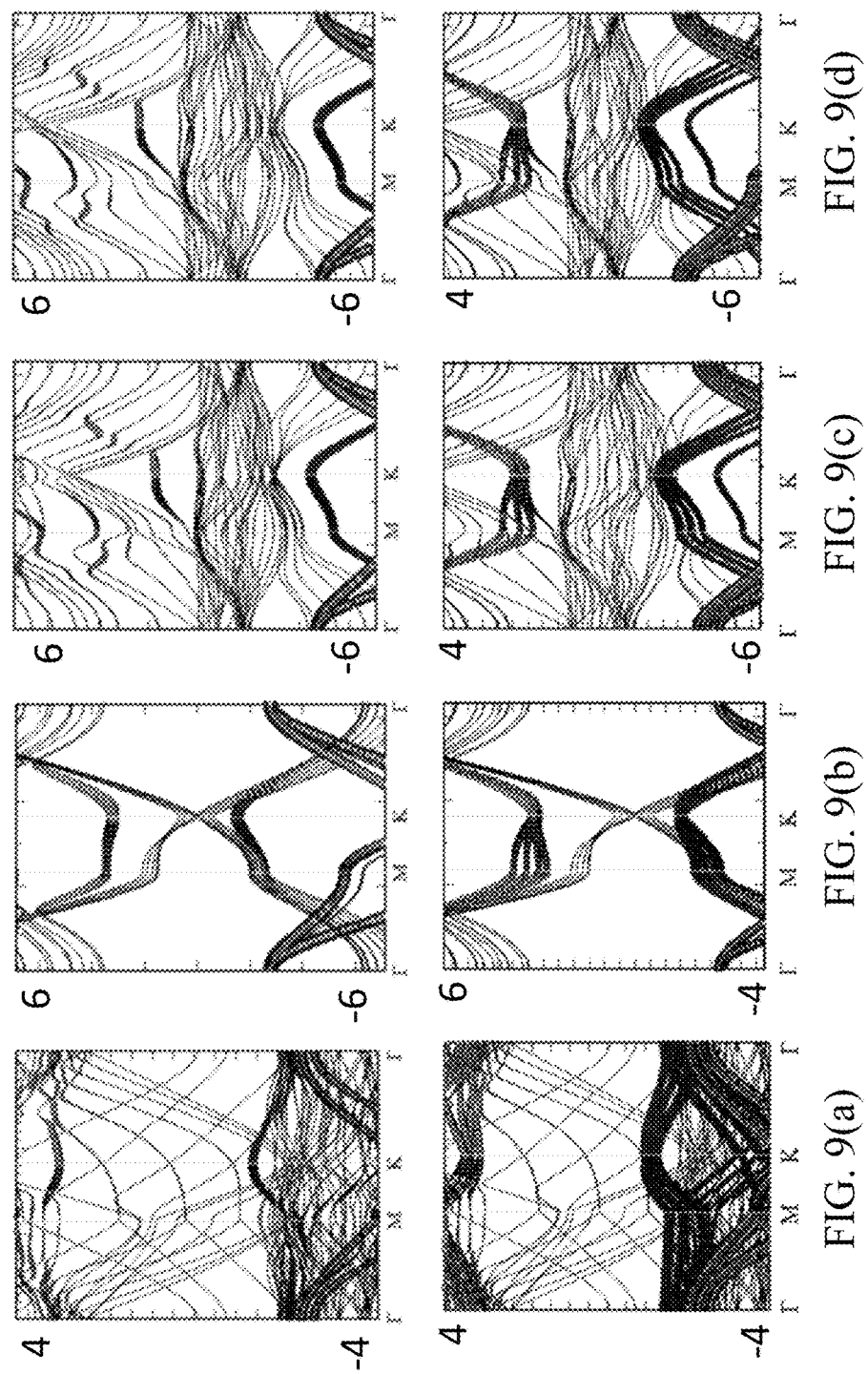
FIG. 9(a) FIG. 9(b) FIG. 9(c) FIG. 9(d)

SEMICONDUCTOR DEVICE AND METHOD OF MAKING THE SAME

CROSS-REFERENCE TO RELATED APPLICATIONS

The present U.S. Patent Application is a divisional of U.S. application Ser. No. 16/718,482, filed Dec. 18, 2019, which is related to and claims the priority benefit of U.S. Provisional Patent Application Ser. No. 62/781,839, filed Dec. 19, 2018, the contents of which is hereby incorporated by reference in their entireties into this disclosure.

TECHNICAL FIELD

This disclosure relates to a semiconductor device and method of making the same.

BACKGROUND

This section introduces aspects that may help facilitate a better understanding of the disclosure. Accordingly, these statements are to be read in this light and are not to be understood as admissions about what is or is not prior art.

High energetic ultraviolet light (UV-C light) is conventionally used to disinfect surfaces. The commercially available UV-C light sources are fluorescent lamps and nitride based light emitting diodes (LEDs). Both device types cast shadows whenever objects are in the light's way. Germs in the shadows survive the disinfection with UV-C light.

SUMMARY

One aspect of the present disclosure relates to a light emitting diode (LED) including a first contact. The LED further includes a first semiconductor layer over the first contact. The first semiconductor layer includes hexagonal Boron Nitride. Additionally, the LED includes a second semiconductor layer over the first semiconductor layer. The second semiconductor layer includes at least one hexagonal Boron Nitride quantum well and at least one hexagonal Boron Nitride quantum barrier. Moreover, the LED includes a third semiconductor layer over the second semiconductor layer. The third semiconductor layer includes hexagonal Boron Nitride. Further, the LED includes a second contact over the third semiconductor layer.

Another aspect of the present disclosure relates to a light emitting diode(LED) including a first contact. The LED further includes a first semiconductor layer over the first contact, wherein the first semiconductor layer includes hexagonal Boron Nitride. The first semiconductor layer includes a p-type doping. Additionally, the LED includes a second semiconductor layer over the first semiconductor layer. The second semiconductor layer includes at least one hexagonal Boron Nitride quantum well and at least one hexagonal Boron Nitride quantum barrier. Further, the LED includes a third semiconductor layer over the second semiconductor layer, wherein the third semiconductor layer includes hexagonal Boron Nitride. The third semiconductor layer includes an n-type doping. Moreover, the LED includes a second contact over the third semiconductor layer.

Still another aspect of the present disclosure relates to a light emitting diode(LED) including a first contact. The first contact includes at least one of graphene or Gold. The LED additionally includes a first semiconductor layer over the first contact. The first semiconductor layer includes hexagonal Boron Nitride. And the first semiconductor layer includes a p-type doping. The p-type doping is performed using at least one of Magnesium or Beryllium. Additionally, the LED includes a second semiconductor layer over the first semiconductor layer. The second semiconductor layer includes at least one hexagonal Boron Nitride quantum well and at least one hexagonal Boron Nitride quantum barrier. The LED also includes a third semiconductor layer over the second semiconductor layer. The third semiconductor layer includes hexagonal Boron Nitride, and the third semiconductor layer includes an n-type doping. The n-type doping is performed using silicon. Moreover, the LED includes a second contact over the third semiconductor layer, wherein the second contact comprises at least one of Cobalt or Nickel. A magnitude of a difference between the one hexagonal Boron Nitride quantum well and the one hexagonal Boron Nitride quantum barrier is larger than 0.01 eV. The one hexagonal Boron Nitride quantum well includes at least one of AA stacking layer, AA' stacking layer, AB stacking layer, AB' stacking layer, or A'B stacking layer. The one hexagonal Boron Nitride quantum barrier includes at least one of AA stacking layer, AA' stacking layer, AB stacking layer, AB' stacking layer, or A'B stacking layer. The second semiconductor layer includes at least five hexagonal Boron Nitride quantum wells and at least five hexagonal Boron Nitride quantum barriers. The at least five hexagonal Boron Nitride quantum wells is over the at least five hexagonal Boron Nitride quantum barriers.

BRIEF DESCRIPTION OF DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

FIG. 1(f) illustrates dependence of bandgap of AA' 2D layer. FIG. 1(g) illustrates dependence of bandgap of AB' 2D layer. FIG. 1(h) illustrates dependence of bandgap of A'B 2D layer. FIG. 1(i) illustrates dependence of bandgap of AB 2D layer. FIG. 1(j) illustrates dependence of bandgap of AA 2D layer. FIG. 1(1) illustrates band structure of 2D AB' stacking h-BN with 4 layers.

FIG. 2(a) illustrates atomic structure of MQW-T1. FIG. 2(b) illustrates atomic structure of MQW-T2. FIG. 2(c) illustrates band structures of MQW-T1. FIG. 2(d) illustrates band structures of MW-T2. FIG. 2(e) illustrates partial charge density in energy range of band offsets between barrier and walls for MQW-T1. FIG. 2(f) illustrates partial charge density in energy range of band offsets between barrier and walls for MQW-T2.

FIG. 9(a) illustrates atomic and associated band structures of monolayer hBN on Au(111). FIG. 9(b) illustrates atomic and associated band structures of monolayer hBN on graphite (0001). FIG. 9(c) illustrates atomic and associated band structures of monolayer hBN on Ni(111). FIG. 9(d) illustrates atomic and associated band structures of monolayer hBN on Co(0001).

DETAILED DESCRIPTION

Figures 1A, 1B, 1C, 1D, 1E:
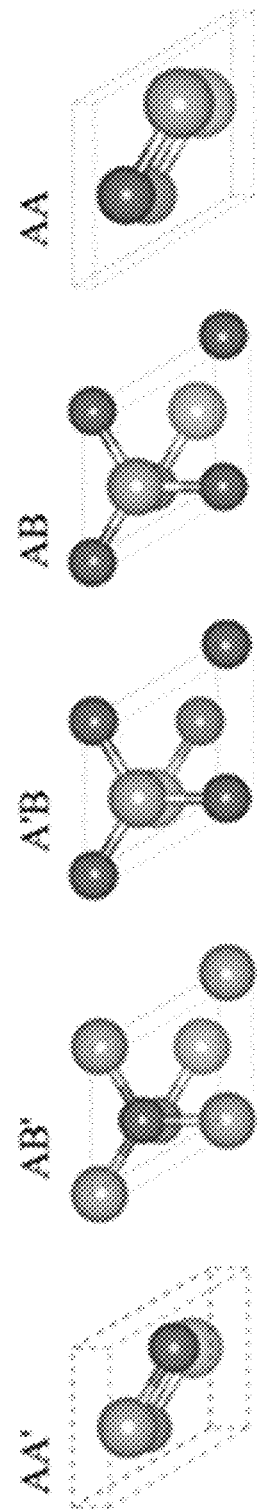
FIG. 1(a) illustrates atomic structures of bulk hBN with AA'.
FIG. 1(b) illustrates atomic structures of bulk hBN with AB'.
FIG. 1(c) illustrates atomic structures of bulk hBN with A'B.
FIG. 1(d) illustrates atomic structures of bulk hBN with AB.
FIG. 1(e) illustrates atomic structures of bulk hBN with AA.
Figures 1K, 1L, 1M, 1N, 1O:
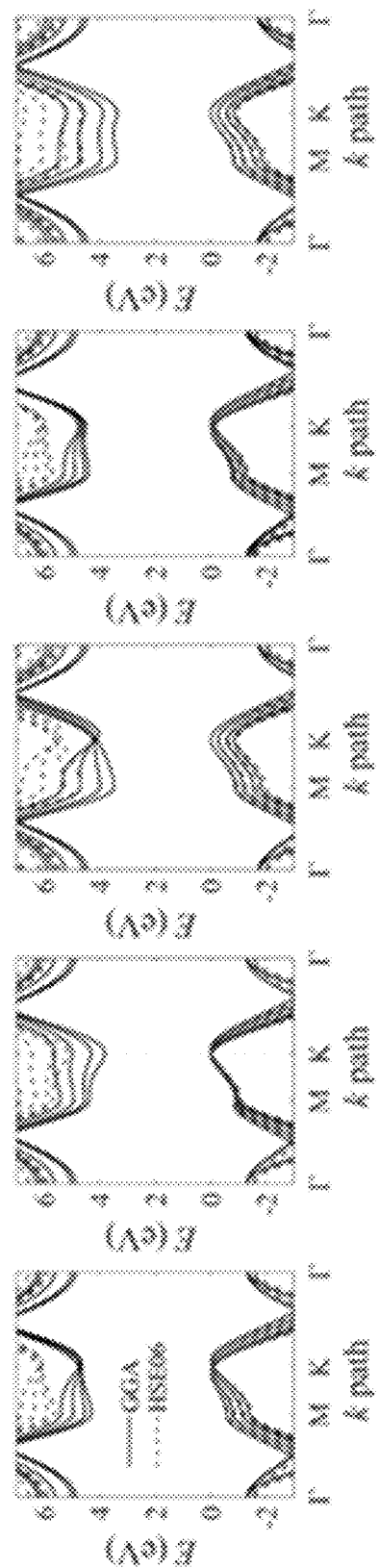
FIG. 1(k) illustrates band structure of 2D AA' stacking h-BN with 4 layers.
FIG. 1(m) illustrates band structure of 2D A'B stacking h-BN with 4 layers.
FIG. 1(n) illustrates band structure of 2D AB stacking h-BN with 4 layers.
FIG. 1(o) illustrates band structure of 2D AA stacking h-BN with 4 layers.

For the purposes of promoting an understanding of the principles of the disclosure, reference will now be made to the embodiments illustrated in the drawings and specific language will be used to describe the same. It will nevertheless be understood that no limitation of the scope of the disclosure is thereby intended.

Various embodiments of the present disclosure relate to using 2-dimensional (2D) material based LEDs to coat various surfaces that need to be disinfected. Germs, such as bacteria, viruses, fungi and parasites can get killed with only little output power of the 2D LED: the proximity effect ensures high efficacy for disinfecting germs.

Example 1: An embodiment of the present disclosure relates to a light emitting diode(LED) including a first contact. The first contact includes at least one of graphene or Gold. The LED additionally includes a first semiconductor layer over the first contact. The first semiconductor layer includes hexagonal Boron Nitride. And the first semiconductor layer includes a p-type doping. The p-type doping is performed using at least one of Magnesium or Beryllium. Additionally, the LED includes a second semiconductor layer over the first semiconductor layer. The second semiconductor layer includes at least one hexagonal Boron Nitride quantum well and at least one hexagonal Boron Nitride quantum barrier. The LED also includes a third semiconductor layer over the second semiconductor layer. The third semiconductor layer includes hexagonal Boron Nitride, and the third semiconductor layer includes an n-type doping. The n-type doping is performed using silicon. Moreover, the LED includes a second contact over the third semiconductor layer, wherein the second contact comprises at least one of Cobalt or Nickel. A magnitude of a difference between the one hexagonal Boron Nitride quantum well and the one hexagonal Boron Nitride quantum barrier is larger than 0.01 eV. The one hexagonal Boron Nitride quantum well includes at least one of AA stacking layer, AA' stacking layer, AB stacking layer, AB' stacking layer, or A'B stacking layer. The one hexagonal Boron Nitride quantum barrier includes at least one of AA stacking layer, AA' stacking layer, AB stacking layer, AB' stacking layer, or A'B stacking layer. The second semiconductor layer includes at least five hexagonal Boron Nitride quantum wells and at least five hexagonal Boron Nitride quantum barriers. The at least five hexagonal Boron Nitride quantum wells is over the at least five hexagonal Boron Nitride quantum barriers.

Example 2: Another embodiment of the present disclosure relates to a light emitting diode (LED) including a first contact. The LED further includes a first semiconductor layer over the first contact. The first semiconductor layer includes hexagonal Boron Nitride. Additionally, the LED includes a second semiconductor layer over the first semiconductor layer. The second semiconductor layer includes at least one hexagonal Boron Nitride quantum well and at least one hexagonal Boron Nitride quantum barrier. Moreover, the LED includes a third semiconductor layer over the second semiconductor layer. The third semiconductor layer includes hexagonal Boron Nitride. Further, the LED includes a second contact over the third semiconductor layer.

The first contact includes at least one of graphene or Gold, whereas the second contact includes at least one of Cobalt or Nickel. A magnitude of difference between the one hexagonal Boron Nitride quantum well and the one hexagonal Boron Nitride quantum barrier is larger than 0.01 eV. In some embodiments, the one hexagonal Boron Nitride quantum well includes at least one of AA stacking layer, AA' stacking layer, AB stacking layer, AB' stacking layer, or A'B stacking layer. In some embodiments, the one hexagonal Boron Nitride quantum barrier includes at least one of AA stacking layer, AA' stacking layer, AB stacking layer, AB' stacking layer, or A'B stacking layer.

In some embodiments, the second semiconductor layer includes at least three hexagonal Boron Nitride quantum wells and at least three hexagonal Boron Nitride quantum barriers, wherein the at least three hexagonal Boron Nitride quantum wells is over the at least three hexagonal Boron Nitride quantum barriers. In some embodiments, the second semiconductor layer includes at least five hexagonal Boron Nitride quantum wells and at least five hexagonal Boron Nitride quantum barriers, wherein the at least five hexagonal Boron Nitride quantum wells is over the at least five hexagonal Boron Nitride quantum barriers.

In one or more embodiments, the first semiconductor layer includes a p-type doping, wherein the p-type doping is performed using at least one of Magnesium or Beryllium.

In one or more embodiments, the third semiconductor layer includes an n-type doping, wherein the n-type doping is performed using silicon.

Example 3: Another embodiment of the present disclosure relates to a light emitting diode(LED) including a first contact. The LED further includes a first semiconductor layer over the first contact, wherein the first semiconductor layer includes hexagonal Boron Nitride. The first semiconductor layer includes a p-type doping. Additionally, the LED includes a second semiconductor layer over the first semiconductor layer. The second semiconductor layer includes at least one hexagonal Boron Nitride quantum well and at least one hexagonal Boron Nitride quantum barrier. Further, the LED includes a third semiconductor layer over the second semiconductor layer, wherein the third semiconductor layer includes hexagonal Boron Nitride. The third semiconductor layer includes an n-type doping. Moreover, the LED includes a second contact over the third semiconductor layer.

The first contact includes at least one of graphene or Gold, while the second contact includes at least one of Cobalt or Nickel. The p-type doping is performed using at least one of Magnesium or Beryllium, while the n-type doping is performed using silicon.

A magnitude of a difference between the one hexagonal Boron Nitride quantum well and the one hexagonal Boron Nitride quantum barrier is larger than 0.01 eV.

In some embodiments, the one hexagonal Boron Nitride quantum well includes at least one of AA stacking layer, AA' stacking layer, AB stacking layer, AB' stacking layer, or A'B stacking layer. In some embodiments, the one hexagonal Boron Nitride quantum barrier comprises at least one of AA stacking layer, AA' stacking layer, AB stacking layer, AB' stacking layer, or A'B stacking layer.

In some embodiments, the second semiconductor layer includes at least three hexagonal Boron Nitride quantum wells and at least three hexagonal Boron Nitride quantum barriers, wherein the at least three hexagonal Boron Nitride quantum wells is over the at least three hexagonal Boron Nitride quantum barriers. In some embodiments, the second semiconductor layer includes at least five hexagonal Boron Nitride quantum wells and at least five hexagonal Boron Nitride quantum barriers, wherein the at least five hexagonal Boron Nitride quantum wells is over the at least five hexagonal Boron Nitride quantum barriers.

Example 4: Hexagonal boron nitride (hBN) is a candidate for its reported band gap and the fact it is a two-dimensional material. Theoretical and experimental studies show the two-dimensional hBN layers can be stacked in various orders. The stacking order is predicted to affect the electronic properties of hBN and can therefore serve as design tool for the electronic structure of hBN based devices. Many requirements for hBN based LEDs have been achieved already—covering the UV-C light emission, the doping of hBN with p-type and n-type carriers, the fabrication of heterostructures and the synthesis of high quality, single atom-thin layers. In spite of the varying experimental findings of the band gap type, hBN shows bright luminescence. A plane-emission device based on hBN and field-emission array showed stable output power of 0.2 mW at 225 nm. High quality atom-thin samples of hBN and their heterostructures can be produced by CVD, mechanical exfoliation, etc. Fabrication of p and n doped hBN has been reported.

Various embodiments of the present application relate to stacking order variations which are shown to confine electrons and holes into LED-typical multi-quantum well structures (MQWs). This carrier confinement is found to have a direct band gap and thus allow for efficient light emission. Schottky barrier heights forming between doped hBN and various metals are calculated and preferred metal/hBN combinations are identified.

All density functional theory (DFT) calculations of this work were run with the VASP simulation package. In most parts the GGA-PBE functionals are applied due to their numerical efficiency. Only when explicitly mentioned, the numerically more expensive HSE06 functionals are applied to verify key GGA results. The cutoff energy was set to 400 eV. The slab model with a vacuum space of over 20 Å is used to simulate each of the 2D systems.

There are five different stacking orders, AA', AB', A'B, AB, and AA (FIGS. 1(a)-1(e)), known for hBN. The AA' and AB stacking have been confirmed in experiments. Although the AB' stacking is predicted to be meta-stable, some experimental results indicate its fabrication. The A'B and AA stacking configurations are predicted to be unstable and have not been found in experiments. Previous work showed marginal differences of the lattice constants of hBN with different stacking order. Therefore, an in-plane lattice constant of 0.25 nm and an interplane distance of 0.333 nm is assumed for all hBN systems in this work.

Figure 5:
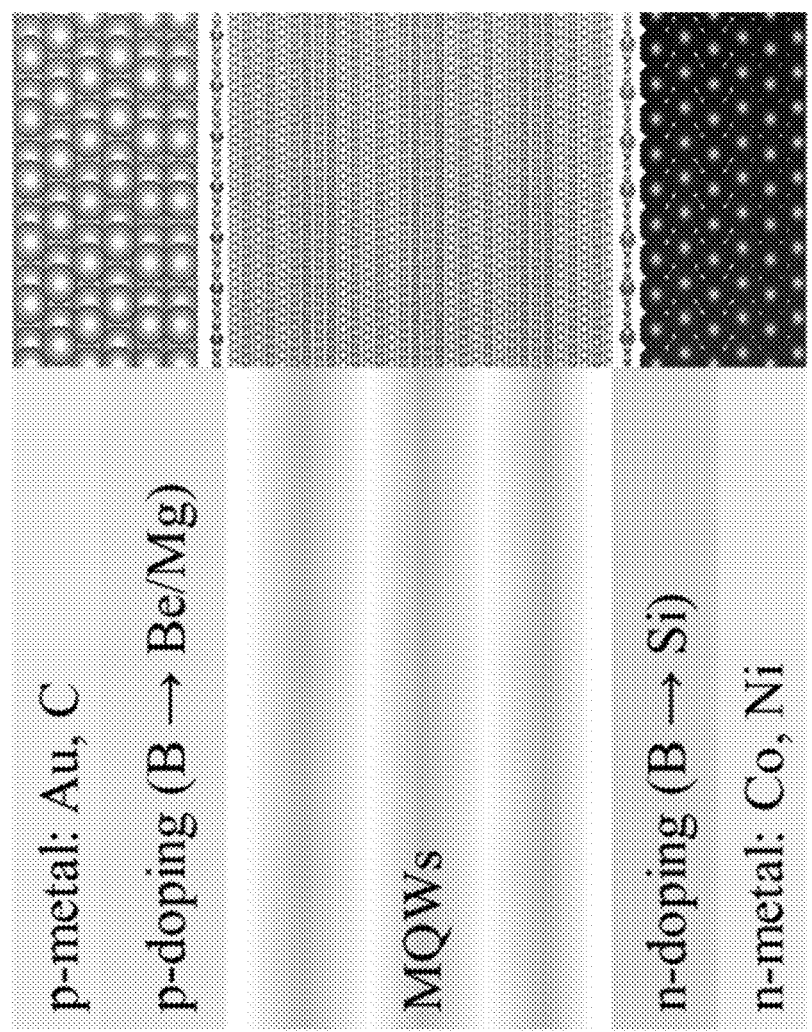
FIG. 5 illustrates a 2-dimensional UV LED based on h-BN.
Figures 6A, 6B, 6C, 6D, 6E:
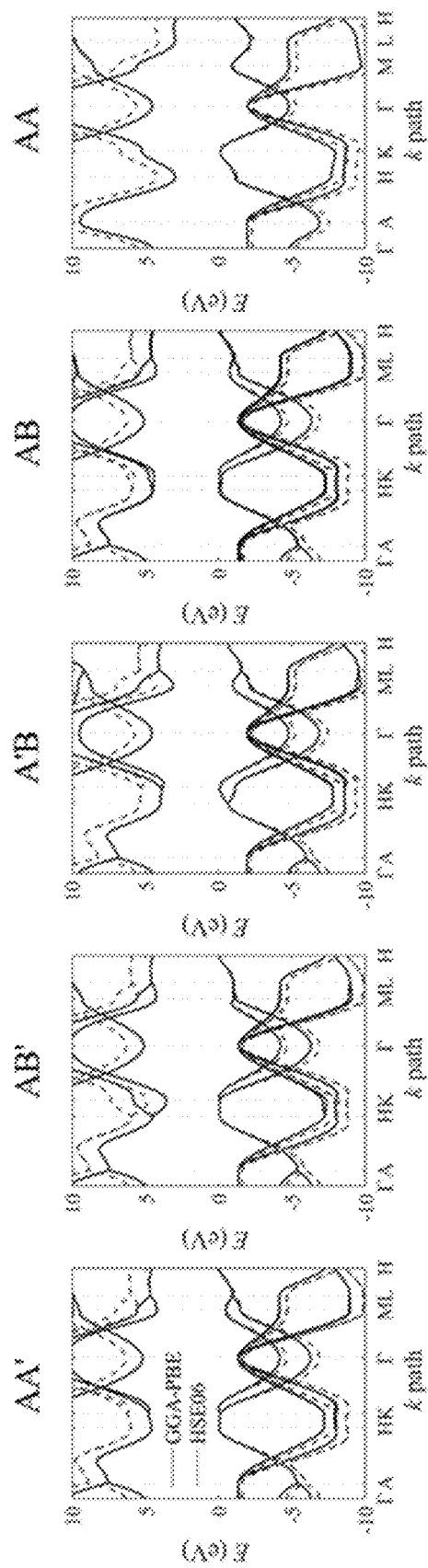
FIG. 6(a) illustrates band structures of bulk hBN with AA' stacking orders.
FIG. 6(b) illustrates band structures of bulk hBN with AB' stacking orders.
FIG. 6(c) illustrates band structures of bulk hBN with A'B stacking orders.
FIG. 6(d) illustrates band structures of bulk hBN with AB stacking orders.
FIG. 6(e) illustrates band structures of bulk hBN with AA stacking orders.
Figure 7:
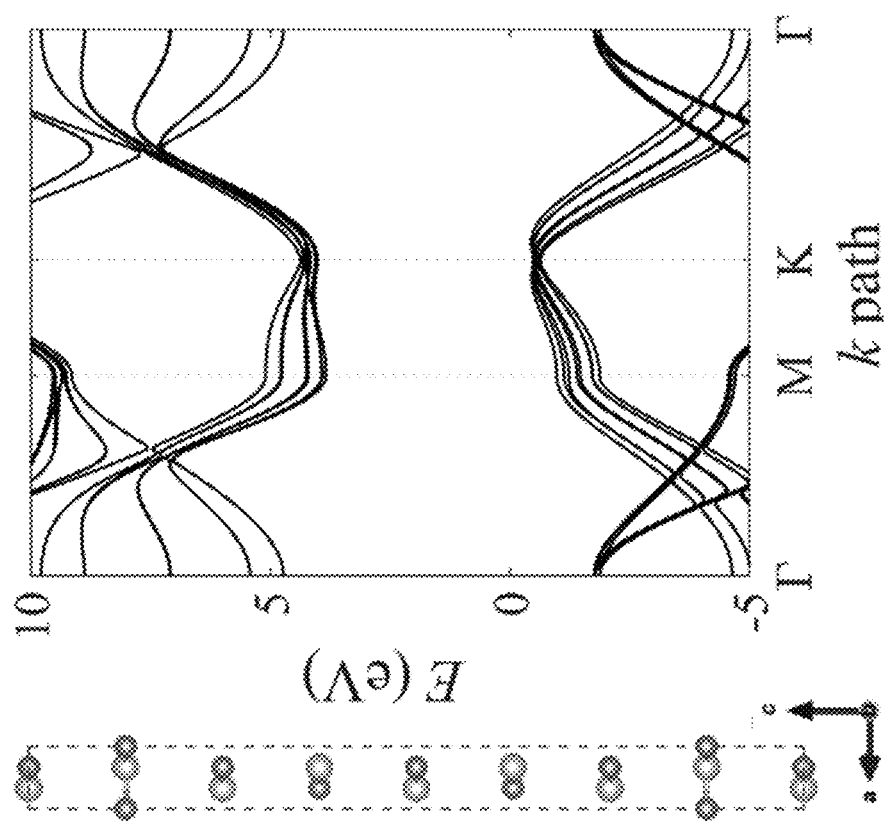
FIG. 7 illustrates atomic and band structures of periodic MQWs composed of AA' and AB stacking for hBN.
Figure 8A:
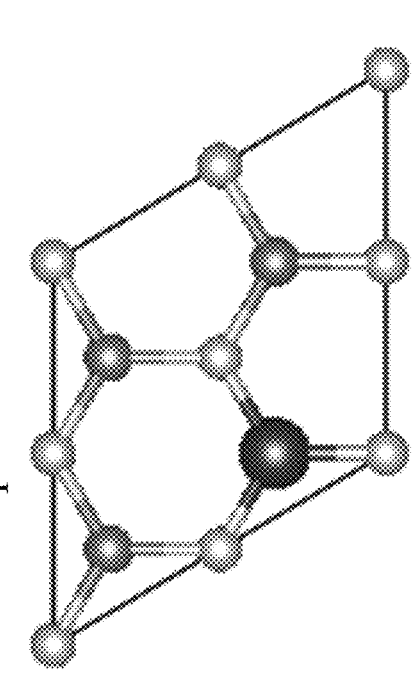
FIG. 8(a) illustrates the density of states (DOS) multiplied with the spin projection in z-direction of Si-doped monolayer hBN with one B atom in a 2*2 superlattice replaced by one Si atom.
Figure 8B:
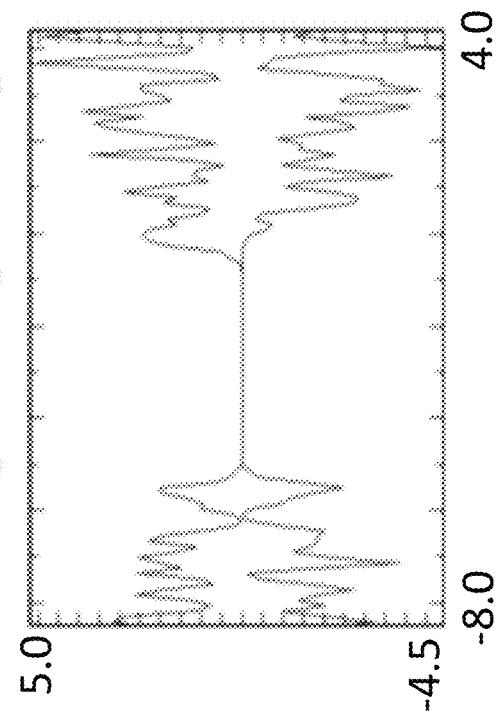
FIG. 8(b) illustrates density of states (DOS) multiplied with the spin projection in z-direction of the system in 8(a) but twice in size in both planar directions.

The band structures of the five hBN stacking orders resulting from GGA and HSE06 functionals for 4 monolayer thick hBN slabs are shown in FIGS. 1(k)-1(o) (see also FIG. 6 for the bulk bandstructure results). Although, GGA underestimates the band gap greatly, both methods give similar band structures and GGA can serve as numerically efficient bandstructure estimations. Consistent with previous DFT results, all the five bulk crystals show indirect band gap, and the gap value is strongly dependent on the stacking orders (FIG. 5). The band gap of bulk AB, AA', AB', A'B, and AA decreases in this order, which is 4.4 (5.7), 4.2 (5.6), 3.6 (4.9), 3.2 (4.4), 3.1 (4.3) eV calculated by GGA (HSE06), respectively. The stacking orders of AA', A'B, and AB show indirect band gaps, with the top of the valence band at or near the K point and the bottom of the conduction band at the M point.

Few-layer thick hBN systems face electronic confinement that increases the material's band gap. Our predictions of the thickness dependent bandgap with GGA and HSE06 are shown in FIGS. 1(f)-1(j). Also shown are particle in a box typical analytical fits (i.e. proportional to (number of layers)') of the bandgap as a function of the number of layers. It is worth to note that the thin layers of hBN have the relative order of bandgap with stacking order as in the bulk scenarios.

As shown in FIGS. 1(k)-1(o), the 4-layer 2D hBN with AA', A'B, and AB stacking forms still show indirect band gap, which have the valence band edges near or at K points and the conductance band (CB) edges at M points. A close-to direct band gap is predicted in the 4-layer AB' and AA hBN: 4 layers of AB' hBN have the conduction band edge at the K point and the valence band edge very close to K. 4 layers of AA hBN yield the valence band edge at K. Their conduction band energies at K and M differ by less than 0.04 eV.

Multiple quantum wells (MQWs): Light emitting diodes typically use quantum wells to trap electrons and holes for a higher radiative recombination probability. The stacking order dependence of the effective band gap of hBN layers allows designing all-hBN multi-quantum well heterostructures. The AA' stacking direction yields a large band gap (see FIG. 1) and can serve as barrier material. Embedding either AA or A'B stacked hBN layers in AA' layers forms quantum wells for electrons and holes. This is confirmed in FIG. 2, which shows two periodic superlattices of hBN composed of several layers of AA', AA and A'B stacking to yield multi-quantum well heterostructures. FIG. 2(a) shows a multi-quantum well superlattice with 4 layers of AA' stacking, alternating with 5 layers of AB' stacking. Note that the interface between AB' and AA' effectively represents an AA bilayer. Another superlattice composed of 3 layers of AA stacking wells and 6 layers of AA' stacking barrier in single unit cell is displayed in FIG. 2(b). They are named as MQW-T1 (FIG. 2(a)) and MQW-T2 (FIG. 2(b)). MQW-T1 has direct band gap of 3.50 (4.79) eV in GGA (HSE06) calculations. By analyzing the partial charge density (PCD), we find clear quantum confinement of the states in AA wells (FIG. 2(e)). The states are mainly in the energy range between −0.21 (−0.24) eV to 0.00 (0.00) eV and in AB' region for energy of 3.50 (4.79) eV to 4.16 (5.50) eV. The energy range of the confined states equals to the band offsets between wells and barriers in FIG. 2(c). For MQW-T2, the band gap is 3.39 (4.60) eV in GGA (HSE06) calculations, and the conductance band edges at K and M points differ by 0.01 (0.07) eV. The energy difference is so small that excitation from VB to CB at room temperature are possible. Similar state confinement in wells has been found with the band offsets of 0.56 (0.63) eV and 0.38 (0.43) eV for electron and hole, respectively. The band offsets of the proposed MQWs are comparable to other UVC LEDs. Bulk hBN has shown considerable photoemission probability. However, we expect the light emission to be greatly improved by the MQWs due to the direct (quasi-direct) band gap and carrier confinement.

Figure 3A:
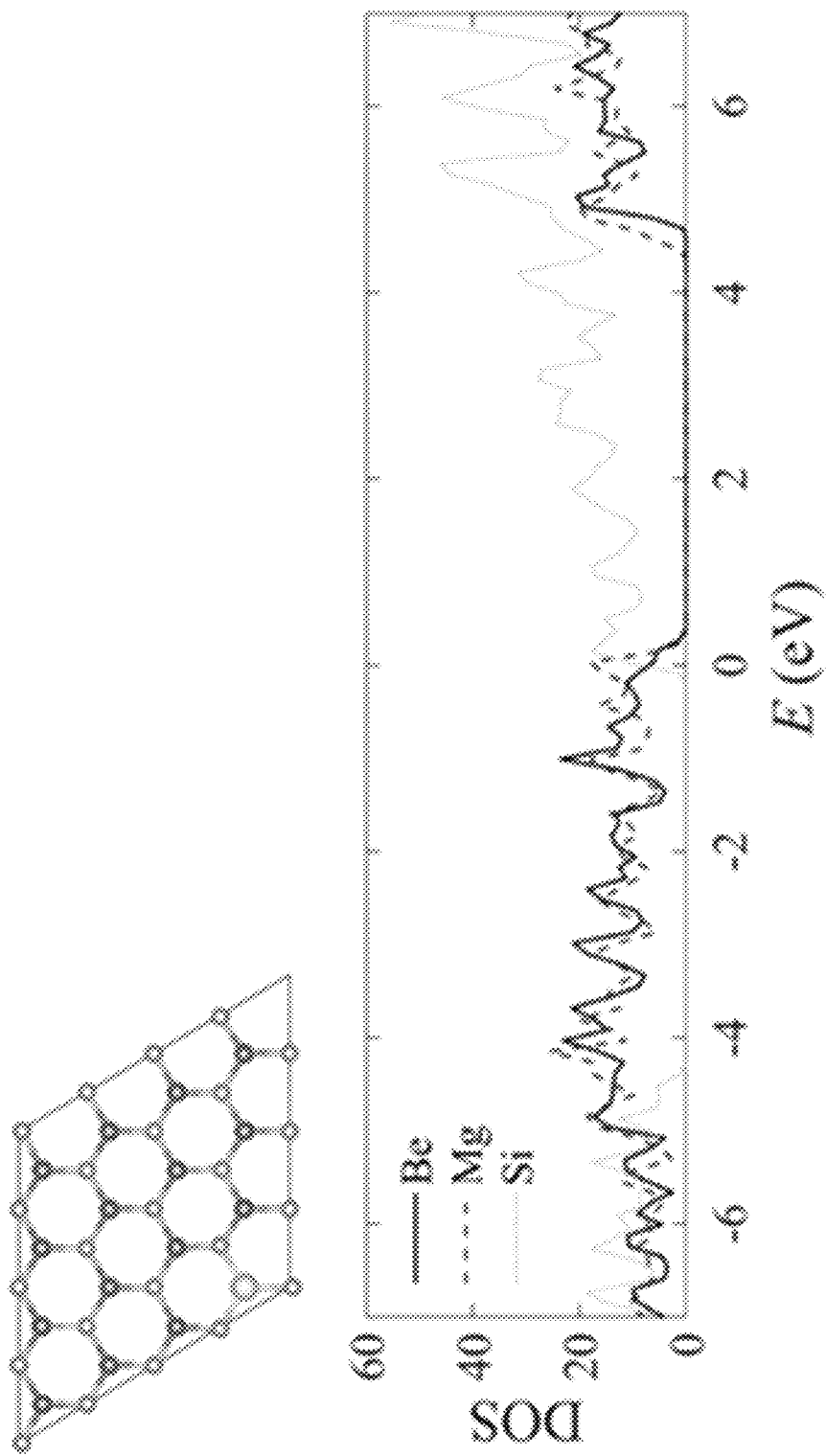
FIG. 3(a) illustrates atomic structure and DOS of Be-doping.
Figure 3B:
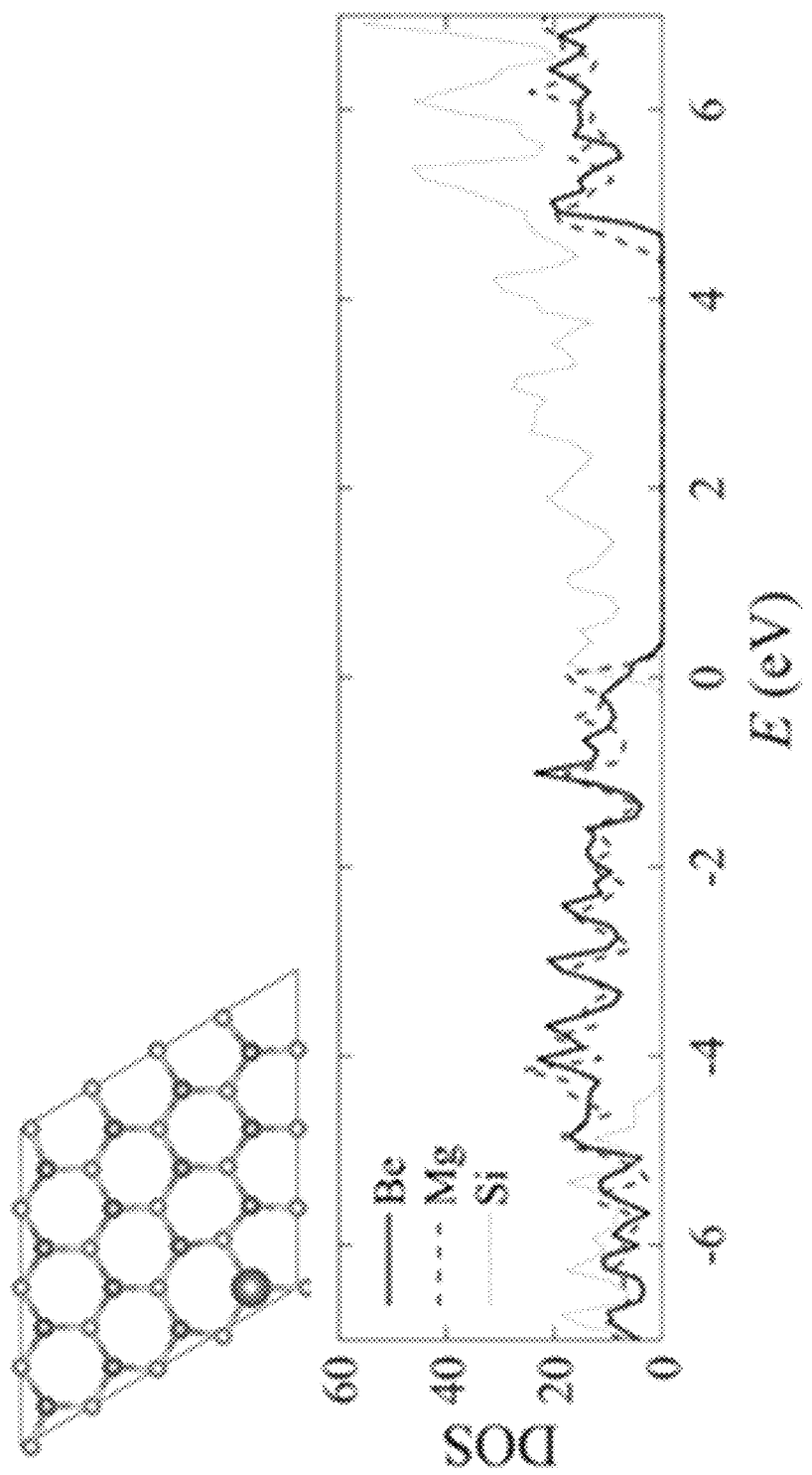
FIG. 3(b) illustrates atomic structure and DOS of Mg-doping.
Figure 3C:
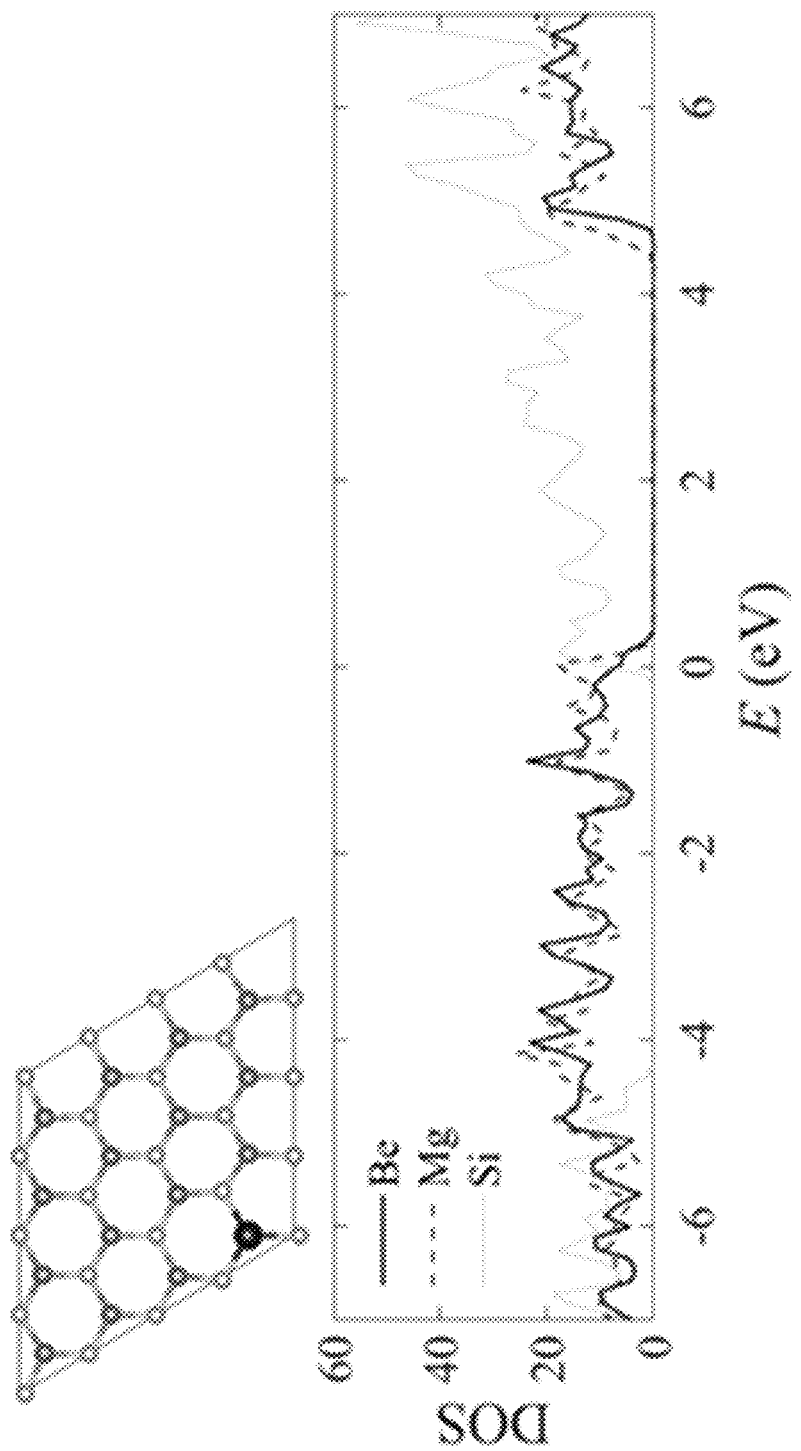
FIG. 3(c) illustrates atomic structure and DOS of Si-doping hBN.
Figures 4A, 4B, 4C, 4D:
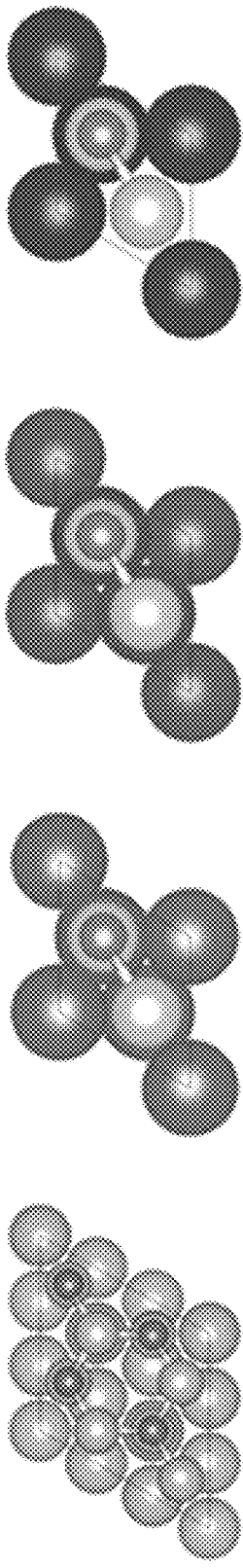
FIG. 4(a) illustrates atomic configuration of 4 layer hBN on Au(111).
FIG. 4(b) illustrates atomic configuration of 4 layer hBN on graphite (0001).
FIG. 4(c) illustrates atomic configuration of 4 layer hBN on Ni(111).
FIG. 4(d) illustrates atomic configuration of 4 layer hBN on Co(0001).
Figure 4E:
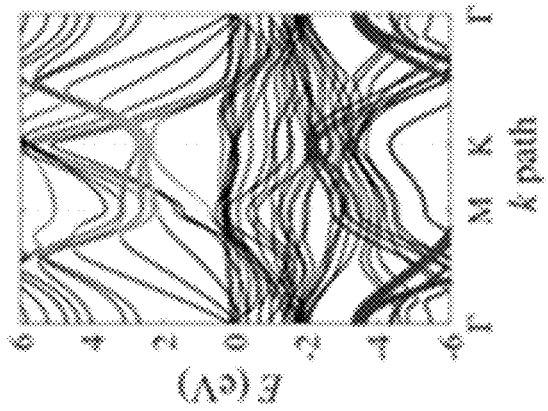
FIG. 4(e) illustrates band structures of 4 layer hBN on Au(111).
Figure 4F:
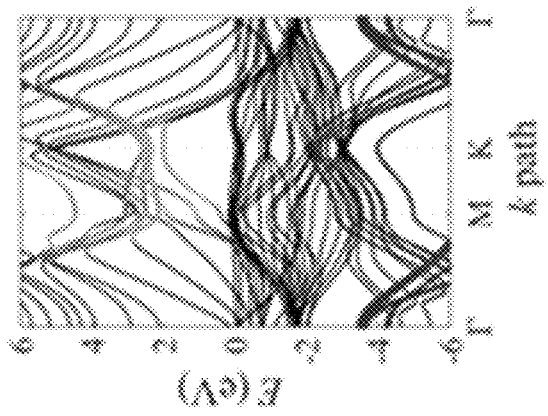
FIG. 4(f) illustrates band structures of 4 layer hBN on graphite (0001).
Figure 4G:
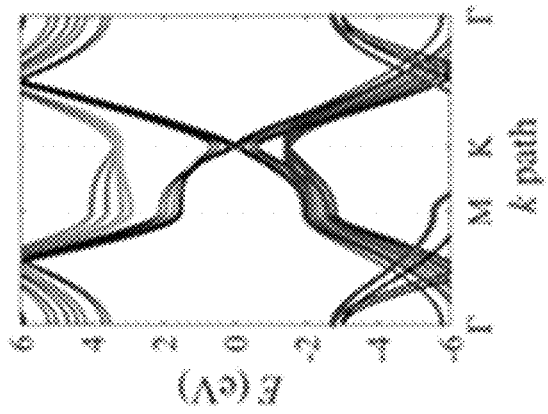
FIG. 4(g) illustrates band structures of 4 layer hBN on Ni(111).
Figure 4H:
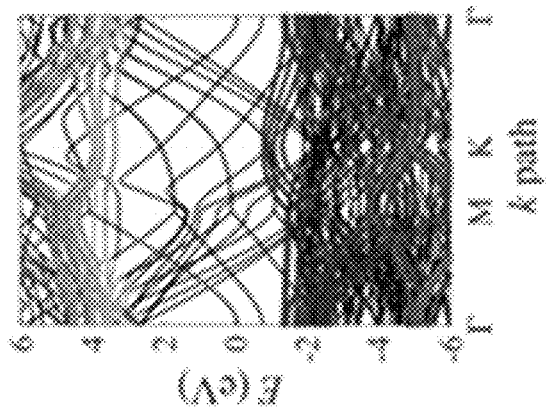
FIG. 4(h) illustrates band structures of 4 layer hBN on Co(0001).

Doping of hBN: underlying each LED structure is a doping profile of a pn junction. To facilitate the doping profile in experiments material-foreign atoms are commonly implemented. We model the doped hBN with a superlattice of 4×4 primitive hBN unit cells and replace one B atom with a dopant atom, i.e. either Si, Mg, or Be. The structure relaxation calculation allows the atomic bonds to change which results in the doping cases in an increase of the unit cell by about 2% (FIGS. 3(a)-3(c)).

The predicted electronic density of states (DOS) in FIG. 3(d) shows that doping hBN with Si atoms pushes the Fermi level (at 0 eV in FIG. 3(d)) by about 0.2 eV into the conduction band, whereas it lies in the valence band for Be (0.3 eV) and Mg (0.4 eV) doping. Note that Si and Be atoms have been shown in experiments to yield n-doping and p-doping in hBN, respectively.

Schottky barrier of hBN-metal contacts: the Schottky barrier heights at the lead metal/semiconductor interfaces are critical for the LED performance. Each Schottky barrier is dependent on the chemical potential difference and atomic configurations of the respective contacts. Therefore, every different doping setup has a different appropriate contact material. The Schottky barrier resulting from four lead materials, i.e. Co, Ni, Au, and graphite when in contact with hBN is assessed here. The hBN/contact interface is modeled with layers of hBN set on 6 layers of the contact material. The cross sectional size of the sample is 1×1 unit cells for hBN on (0001) Co, (111) Ni, and (0001) graphite. When hBN is interfaced with (111) Au, 2×2 unit cells are used (see FIGS. 4(a)-4(d)). The relaxation of two layers of hBN and two layers of the respective contact material closest to the interface is based on the "optB88-vdW-DF" DFT functional which includes the van der Waals interactions between hBN and the contact material. The remaining layers are assumed to be unstrain. The resulting lattice mismatch is less than 2% in all considered interfaces. Electronic band structures solved with GGA-PBE functionals on the relaxed structures are shown in FIGS. 4(e)-4(h). The projections on B and N atoms are showed in green and red, respectively. Comparison with the complete bandstructure in black allows to identify the Schottky barriers by $$\Phi_e = E_C - E_F$$

$$\Phi_h = E_F - E_V$$

respectively, where EF is the Fermi energy level of the respective hBN/metal interface (at 0 in FIG. 4), EC (EV) is the conductance (valence) band edge of hBN which can be extracted by projected atomic contributions of boron and nitride atoms for the total band structure of hBN/metal interfaces. The results in the table below identify Au and graphite as good contact metals for p-doped hBN. Co and Ni are suitable to connect n-doping hBN.

The electron and hole schottky barrier heights ($\varphi_e$ and $\varphi_h$) for contacts between intrinsic h-BN and several metals (Au, graphite, Ni, Co).

|  |  | Au | C | Ni | Co |
|---|---|---|---|---|---|
| 4L-PBE | $\phi_p$ (eV) | 0.96 | 1.42 | 2.36 | 2.80 |
|  | $\phi_n$ (eV) | 3.43 | 2.91 | 1.67 | 1.37 |

Figure 10B:
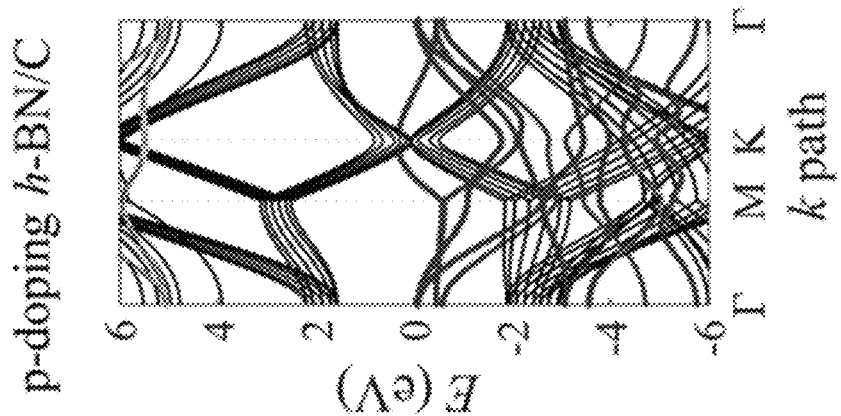
FIG. 10(b) illustrates atomic and band structures of Be-doped-hBN/graphite interface.
Figure 10A:
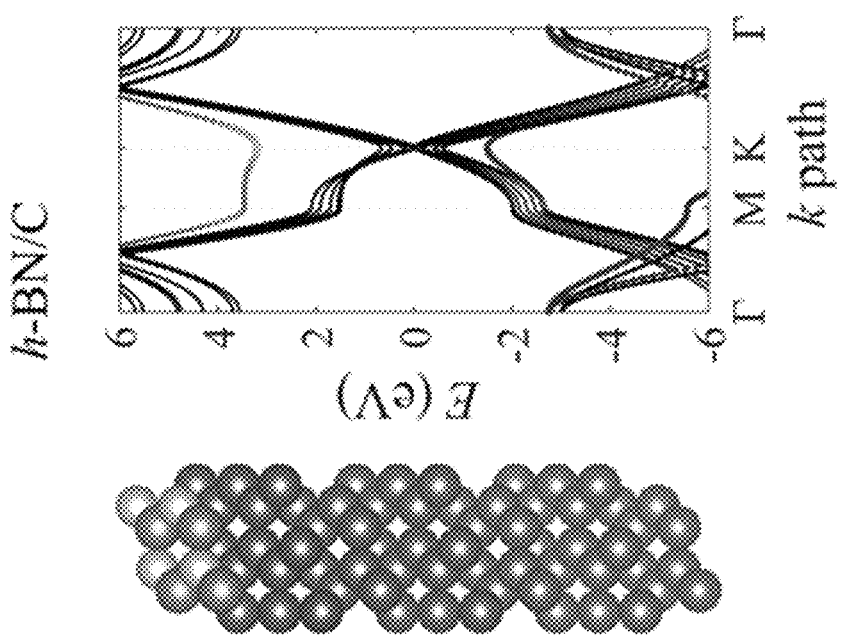
FIG. 10(a) illustrates atomic and band structures of undoped-hBN/graphite interface.

Besides considering intrinsic-hBN/metal interfaces, we also check the doping effect of hBN on the Schottky barrier. Since the heavy-doped hBN is degenerated semiconductor with Fermi level below (above) valence (conductance) band and show some metallic-like properties, the doped-hBN/metal contacts hardly show any Schottky barrier (FIG. 10).

The whole UVC-LED structure is proposed in FIG. 5. The MQWs with clear quantum confinement are built up using h-BN with different thickness and stacking orders. Au and graphite are good candidates for p metals, while Ni and Co can be used for n metals. The n-doping and p-doping h-BN can be realized and doping effect on Schottky barrier of BN/metal contact are tested.

Example 5: A method of forming a light emitting diode (LED) includes forming a first contact. In at least one embodiment, the first contact is formed using a metalorganic chemical vapor deposition (MOCVD) process. In some embodiments, the first contact is formed using molecular beam epitaxy (MBE), hydride vapor phase epitaxy (HVPE), or other suitable formation method. The first contact includes at least one of graphene or gold.

The method additionally includes forming a first semiconductor layer over the first contact. In at least one embodiment, the first semiconductor layer is formed using a metalorganic chemical vapor deposition (MOCVD) process. In some embodiments, the first semiconductor layer is formed using molecular beam epitaxy (MBE), hydride vapor phase epitaxy (HVPE), or other suitable formation method. In some embodiments, the first semiconductor layer includes hexagonal Boron Nitride. In at least one embodiment, the first semiconductor layer includes a p-type doping. In one or more embodiments, the p-type doping is performed using at least one of Magnesium or Beryllium.

The method additionally includes forming a second semiconductor layer over the first semiconductor layer. In at least one embodiment, the second semiconductor layer is formed using a metalorganic chemical vapor deposition (MOCVD) process. In some embodiments, the second semiconductor layer is formed using molecular beam epitaxy (MBE), hydride vapor phase epitaxy (HVPE), or other suitable formation method. In some embodiments, the second semiconductor layer includes at least one hexagonal Boron Nitride quantum well and at least one hexagonal Boron quantum barrier.

The method additionally includes forming a third semiconductor layer over the second semiconductor layer. In at least one embodiment, the third semiconductor layer is formed using a metalorganic chemical vapor deposition (MOCVD) process. In some embodiments, the third semiconductor layer is formed using molecular beam epitaxy (MBE), hydride vapor phase epitaxy (HVPE), or other suitable formation method. In some embodiments, the third semiconductor layer includes hexagonal Boron Nitride. In at least one embodiment, the third semiconductor layer includes an n-type doping. In one or more embodiments, the n-type doping is performed using silicon.

Moreover, the method includes forming a second contact over the third semiconductor layer. In at least one embodiment, the second contact is formed using a metalorganic chemical vapor deposition (MOCVD) process. In some embodiments, the second contact is formed using molecular beam epitaxy (MBE), hydride vapor phase epitaxy (HVPE), or other suitable formation method. The second contact includes at least one of Cobalt or Nickel.

In one or more embodiments, a magnitude of a difference between the one hexagonal Boron Nitride quantum well and the one hexagonal Boron Nitride quantum barrier is larger than 0.01 eV. The one hexagonal Boron Nitride quantum well includes at least one of AA stacking layer, AA' stacking layer, AB stacking layer, AB' stacking layer, or A'B stacking layer. The one hexagonal Boron Nitride quantum barrier includes at least one of AA stacking layer, AA' stacking layer, AB stacking layer, AB' stacking layer, or A'B stacking layer.

The second semiconductor layer comprises at least five hexagonal Boron Nitride quantum wells and at least five hexagonal Boron Nitride quantum barriers. The at least five hexagonal Boron Nitride quantum wells is over the at least five hexagonal Boron Nitride quantum barriers.

One of ordinary skill in the art would recognize that operations are added or removed from method, in one or more embodiments. One of ordinary skill in the art would also recognize that an order of operations in the above method is able to be changed, in some embodiments.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, design, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

The invention claimed is:

1. A light emitting diode (LED) comprising:
    (a) a first contact;
    (b) a first semiconductor layer disposed over the first contact;
    (c) a second semiconductor layer disposed over the first semiconductor layer, wherein the second semiconductor layer includes at least one hexagonal Boron Nitride quantum well and at least one hexagonal Boron Nitride quantum barrier;
    (d) a third semiconductor layer disposed over the second semiconductor layer; and
    (e) a second contact positioned over the third semiconductor layer.

2. The LED of claim 1, wherein each of the first semiconductor layer and the third semiconductor layer includes hexagonal Boron Nitride.

3. The LED of claim 1, wherein the first contact includes at least one of graphene or gold.

4. The LED of claim 1, wherein the second contact includes at least one of nickel or cobalt.

5. The LED of claim 1, wherein the first semiconductor layer includes a p-type doping.

6. The LED of claim 5, the p-type doping is performed using at least one of beryllium or magnesium.

7. The LED of claim 1, wherein the third semiconductor layer includes an n-type doping, wherein the n-type doping is performed using silicon.

8. The LED of claim 7, wherein the n-type doping is performed using silicon.

9. The LED of claim 1, wherein the one hexagonal Boron Nitride quantum well includes at least one of an AA stacking layer, AA' stacking layer, AB stacking layer, AB' stacking layer, or A'B stacking layer.

10. The LED of claim 1, wherein the one hexagonal Boron Nitride quantum barrier includes at least one of an AA stacking layer, AA' stacking layer, AB stacking layer, AB' stacking layer, or A'B stacking layer.

11. The LED of claim 1, wherein the second semiconductor layer includes at least three hexagonal Boron Nitride quantum wells and at least three hexagonal Boron Nitride quantum barriers, wherein the at least three hexagonal Boron Nitride quantum wells is over the at least three hexagonal Boron Nitride quantum barriers.

12. A light emitting diode (LED) comprising:
    (a) a first contact;
    (b) a first semiconductor layer disposed over the first contact, wherein the first semiconductor layer includes p-type doping;
    (c) a second semiconductor layer disposed over the first semiconductor layer, wherein the second semiconductor layer includes at least one hexagonal Boron Nitride quantum well and at least one hexagonal Boron Nitride quantum barrier;
    (d) a third semiconductor layer over the second semiconductor layer, wherein the third semiconductor layer includes an n-type doping; and
    (e) a second contact positioned over the third semiconductor layer.

13. The LED of claim 12, wherein the first contact includes at least one of graphene or nickel.

14. The LED of claim 12, wherein the one hexagonal Boron Nitride quantum well includes at least one of an AA stacking layer, AA' stacking layer, AB stacking layer, AB' stacking layer, or A'B stacking layer.

15. The LED of claim 12, wherein the one hexagonal Boron Nitride quantum barrier includes at least one of an AA stacking layer, AA' stacking layer, AB stacking layer, AB' stacking layer, or A'B stacking layer.

16. The LED of claim 11, wherein each of the first semiconductor layer and the third semiconductor layer includes hexagonal Boron Nitride.

17. A light emitting diode (LED) comprising:
(a) a first contact;
(b) a first semiconductor layer disposed over the first contact, wherein the first semiconductor layer includes hexagonal Boron Nitride and p-type doping;
(c) a second semiconductor layer disposed over the first semiconductor layer, wherein the second semiconductor layer includes at least five hexagonal Boron Nitride quantum wells and at least five hexagonal Boron Nitride quantum barriers, wherein a magnitude of a difference between one hexagonal Boron Nitride quantum well and one hexagonal Boron Nitride quantum barrier is larger than 0.01 eV;
(d) a third semiconductor layer disposed over the second semiconductor layer, wherein the third semiconductor layer includes hexagonal Boron Nitride and n-type doping; and
(e) a second contact positioned over the third semiconductor layer.

18. The LED of claim 17, wherein the one hexagonal Boron Nitride quantum well includes at least one of an AA stacking layer, AA' stacking layer, AB stacking layer, AB' stacking layer, or A'B stacking layer.

19. The LED of claim 17, wherein the one hexagonal Boron Nitride quantum barrier includes at least one of an AA stacking layer, AA' stacking layer, AB stacking layer, AB' stacking layer, or A'B stacking layer.

* * * * *